(12) United States Patent
Karunadasa et al.

(10) Patent No.: US 9,564,593 B2
(45) Date of Patent: Feb. 7, 2017

(54) SOLAR CELLS COMPRISING 2D-PEROVSKITES

(71) Applicant: The Board of Trustees of the Leland Stanford Junior University, Palo Alto, CA (US)

(72) Inventors: Hemamala Indivari Karunadasa, Palo Alto, CA (US); Ian Smith, Palo Alto, CA (US); Michael David McGehee, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/733,462

(22) Filed: Jun. 8, 2015

(65) Prior Publication Data
US 2015/0357591 A1    Dec. 10, 2015

Related U.S. Application Data

(60) Provisional application No. 62/008,704, filed on Jun. 6, 2014.

(51) Int. Cl.
| H01L 31/00 | (2006.01) |
| H01L 51/00 | (2006.01) |
| H01L 31/0256 | (2006.01) |
| H01L 51/42 | (2006.01) |
| H01L 51/44 | (2006.01) |

(52) U.S. Cl.
CPC ....... *H01L 51/0032* (2013.01); *H01L 31/0256* (2013.01); *H01L 51/0045* (2013.01); *H01L 51/4226* (2013.01); *H01L 51/4253* (2013.01); *H01L 51/0003* (2013.01); *H01L 51/442* (2013.01); *Y02E 10/50* (2013.01); *Y02E 10/549* (2013.01)

(58) Field of Classification Search
CPC ............. H01L 31/0256; H01L 51/4253; H01L 51/442; H01L 51/0032; H01L 51/0045; Y02E 10/50
USPC .................................. 136/252, 263
See application file for complete search history.

(56) References Cited

FOREIGN PATENT DOCUMENTS

GB    WO 2014045021 A1 *    3/2014    ........... H01L 51/422

OTHER PUBLICATIONS

Yi Wei. "Synthesis and optical properties of self-assembled 2D layered orgnic-inorganic perovskites for optoelectronics". Thesis. ENS Cachan, Jul. 2012.*
Tanaka et al. "Bandgap and exciton binding energies in lead-iodide-based natural quantum-well crystals". 2003. Science and technology or advanced materials, 4:6, 599-604.*
Lee et al. "Efficient hybrid solar cells based on meso-superstructured organometal halide perovskites". Science 338, 643-647 (2012).*

* cited by examiner

*Primary Examiner* — Lindsey Bernier
(74) *Attorney, Agent, or Firm* — Kaplan Breyer Schwarz & Ottesen, LLP

(57) ABSTRACT

A solar cell includes a light-absorbing layer comprising a 2d-perovskite.

17 Claims, 2 Drawing Sheets

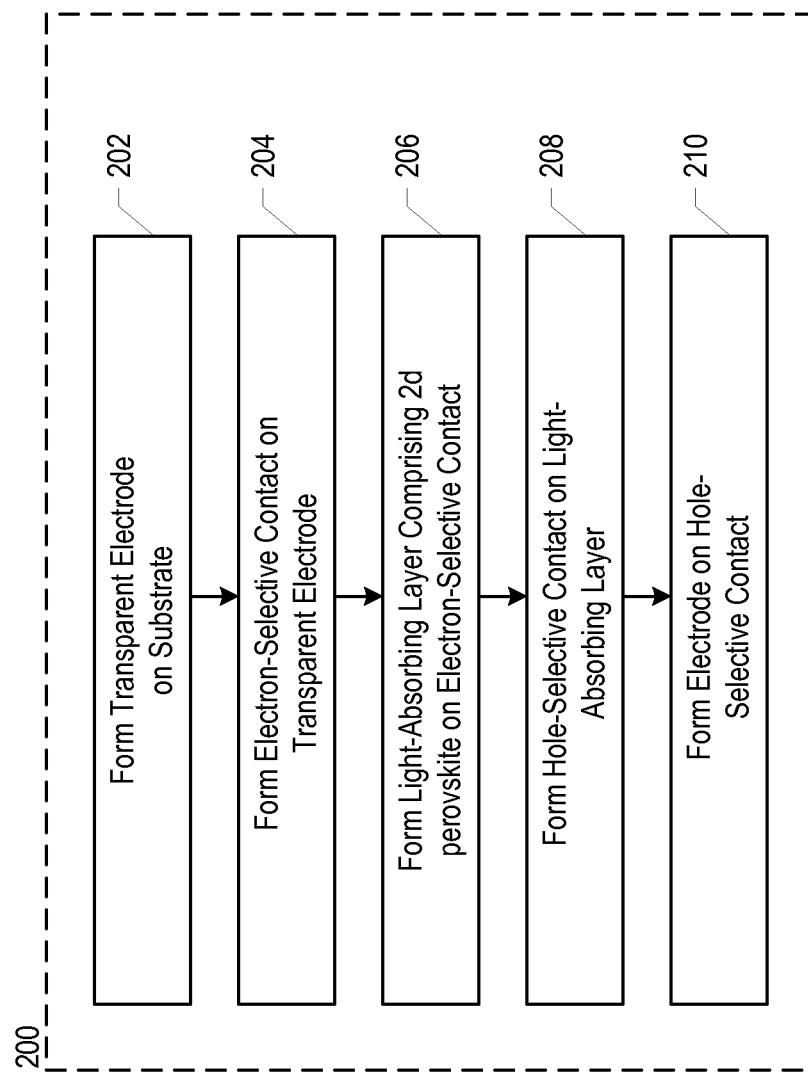

SOLAR CELLS COMPRISING 2D-PEROVSKITES

This case claims priority to U.S. Pat. Appl. No. 62/008,704 filed on Jun. 6, 2014 and which is incorporated by reference herein.

FIELD OF THE INVENTION

The present invention relates generally to solar cells.

BACKGROUND OF THE INVENTION

Pressure to use renewable energy sources is growing. One renewable energy source is the sun. Energy from the sun can be harvested by converting sunlight to electricity using a photovoltaic cell or a photoelectrochemical cell. Both such cells are commonly known as "solar cells."

A basic photovoltaic cell includes a light-absorbing region bounded on one side by a hole-selective contact and on the other side by an electron-selective contact. When sunlight shines on a photovoltaic cell, it can be reflected, absorbed, or transmitted. Only the light that is absorbed in the light-absorbing region ultimately generates electricity. More particularly, only photons having an energy that is at least equal to the band gap of the light-absorbing region can free an electron in that region. The band gap for most photovoltaics is 1.1-1.7 eV. The selective contacts act like sinks for either electrons or holes and each contact establishes a potential gradient. The potential gradient generates a drift current.

Recently, researchers have been experimenting with three-dimensional (3d) hybrid perovskites of the form (MA)[PbX$_3$] for use as the light-absorbing layer of solar cells (where: MA=CH$_3$NH$_3^+$ and X=Cl, Br, or I).

High-quality films of 3d hybrid perovskites can be formed via thermal evaporation and two-step vapor or dip-conversion methods. Simpler deposition methods, such as single-step spin coating or dipcoating, can be used, but they produce lower quality films, which negatively impact solar-cell performance. Furthermore, 3d-perovskites are not stable in the presence of moisture, thereby requiring anhydrous processing conditions.

SUMMARY OF THE INVENTION

The present invention provides, for use in a solar cell, a perovskite-based light-absorbing layer that avoids the aforementioned drawbacks of the prior art. In accordance with the illustrative embodiment of the invention, a solar cell includes, as a light-absorbing layer, a layered, two-dimensional (2d) perovskite having the structure:

$$(A)_2(B)_{n-1}[M_nX_{3n+1}] \quad [1]$$

where:
A=RNH$_3^+$, R=organic group
B=R'NH$_3^+$, R'=organic group
M=metal
X=anion
n denotes that number of M-X sheets in each inorganic layer.

In the illustrative embodiment, R=C$_6$H$_5$(CH$_2$)$_2$, R'=CH$_3$, M=Pb (lead), X=I (iodide). Thus, for the illustrative embodiment, structure [1] reduces to:

$$(PEA)_2(MA)_{n-1}[Pb_nI_{3n+1}] \quad [2]$$

where:
PEA=C$_6$H$_5$(CH$_2$)$_2$NH$_3^+$ (2-phenylethylammonium),
MA=CH$_3$NH$_3^+$ (methylammonium)
n denotes that number of Pb—I sheets in each inorganic layer.

The 2d-perovskites are not similar to 3d-perovskites, either electronically or chemically. Similar to the differences between graphene and graphite, for example, the 2d materials have unique properties not seen in the 3d analog.

Most 2d-perovskites form n=1 structures. With respect to electronic properties, n=1 structures have large exciton-binding energies, which results in excited electrons and holes that are strongly attracted to each other. Such structures are ill-suited for use as the light-absorbing layer of a solar-cell because the electrons and holes are too strongly bound to be separated at the electron/hole selective contacts.

Furthermore, reducing the dimensionality of the inorganic component from the 3d structure to the 2d structure results in an increase in bandgap. For example, the n=1 structure of the 2d-perovskite has a bandgap 2.57 eV compared to a bandgap of 1.61 eV for a 3d-perovskite of the form (MA)[PbX$_3$]. The optimal value for the bandgap is 1.34 eV, which provides the highest theoretical efficiency for a single-junction solar cell. Thus, 2d-perovskites of n=1 typically have an unsuitable or at least much less-desirable bandgap for use as a light-absorbing layer than 3d-perovskites.

With respect to chemical structure, the 3d structure of the form [PbI$_3$](1−) has only bridging iodides between Pb sites. The 2d structure of the form [PbI$_4$](2−) for n=1 has four bridging iodides and two non-bridging iodides per metal.

Notwithstanding the foregoing, the inventors recognized that 2d-perovskites possess certain other characteristics that would be advantageous in the context of a solar cell if a structure having a suitable bandgap could be identified. In particular, unlike their 3d analogs, 2d-perovskites readily form high-quality films that are relatively resistant to the effects of humidity.

The layered (2d) perovskite can be structurally derived from the 3d analog by "slicing" (conceptually) along specific crystallographic planes, for example, (100), (110), etc. The interlayer separation and thickness of the inorganic layers can be controlled through choice of organic groups. To synthesize crystals of the n=3 member of structure [2], the inventors combined (PEA)I, (MA)I, and PbI$_2$ in a 2:2:3 stoichiometric ratio in a nitromethane/acetone mixture. The solvent was allowed to slowly evaporate at room temperature. The resulting structure is the first crystallographically characterized n=3 lead perovskite. It showed inorganic layers including three Pb—I sheets partitioned by ordered bilayers of PEA cations. The inorganic framework of this structure is conceptually derived from (MA)PbI$_3$ by "slicing" along the (100) direction of the cubic structure. Using different organic groups (i.e., other than PEA), other 2d perovskites can be formed, wherein the inorganic framework appears as if (MA)PbI$_3$ has been "sliced" along a different crystallographic plane (e.g., (110), etc.).

The inventors discovered that the n=3 lead-iodide perovskite provides a compromise between the strongly bound excitons of n=1 perovskites, ill-suited as a solar-cell absorber and the weakly bound excitons of the 3d-perovskite. Absorbance measurements showed an exciton band at 2.06 eV, which is close to the estimated bandgap of about 2.1 eV for the n=3 structure.

Although the bandgap of the n=3 structure is larger than the optimal value of 1.34 eV and currently provides a lower PCE compared to the 3d-perovskite, a high-quality film of the n=3 lead-iodide 2d-perovskite can be deposited via a one-step spincoating process under ambient conditions with no annealing steps. This is not the case for 3d-perovskites, which require high-temperature thermal evaporation steps or multistep deposition processes (e.g., heat-assisted conversion of spincoated $PbI_2$ films to the perovskite via exposure to (MA)I solution or vapor, or simultaneous deposition of $PbCl_2$ and (MA)I and high-temperature annealing).

Also, the 2d-based film was found to be far more moisture resistant than those formed from 3d-perovskites, such that solar cells incorporating 2d-based films can be fabricated under humid conditions. By contrast, 3d-perovskites require anhydrous processing and operating conditions. A solar cell incorporating the n=3 lead-iodide perovskite as a light-absorbing layer generated an open-circuit voltage of 1.1 V and a power conversion efficiency ("PCE") of 4.73 percent.

In accordance with some embodiments, a solar cell in accordance with the present teachings includes a light-absorbing layer comprising a layered 2d-perovskite having the form:

where:
A=$RNH_3^+$, R=organic group
B=$R'NH_3^+$, R'=organic group
M=metal
X=anion
n denotes the number of M-X sheets in each inorganic layer (structurally corresponding to a slice of the 3d perovskite along a specific crystallographic plane, for example <100> or <110>).

In accordance with some embodiments, a solar cell in accordance with the present teachings includes a light-absorbing layer comprising a layered 2d-perovskite having the form:

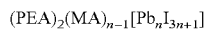

where:
PEA=$C_6H_5(CH_2)_2NH_3^+$,
MA=$CH_3NH_3^+$, and
n denotes the number of Pb—I sheets in each inorganic layer.

In accordance with some embodiments, a solar cell in accordance with the present teachings includes a light-absorbing layer comprising a layered 2d-perovskite having the form:

where:
PEA=$C_6H_5(CH_2)_2NH_3^+$,
MA=$CH_3NH_3^+$

In accordance with some embodiments, a method for making a solar cell in accordance with the present teachings comprises: forming a transparent electrode; forming an electron-selective contact on the transparent electrode; forming a light-absorbing layer on the electron-selective contact, wherein the light-absorbing layer comprises a 2d-perovskite; forming a hole-selective contact on the light-absorbing layer; and forming an electrode on the hole-selective contact.

BRIEF DESCRIPTION OF THE DRAWINGS

FIG. 2 depicts method 200 for fabricating a light-absorbing layer for a solar cell in accordance with an illustrative embodiment.

DETAILED DESCRIPTION

Figure 1:
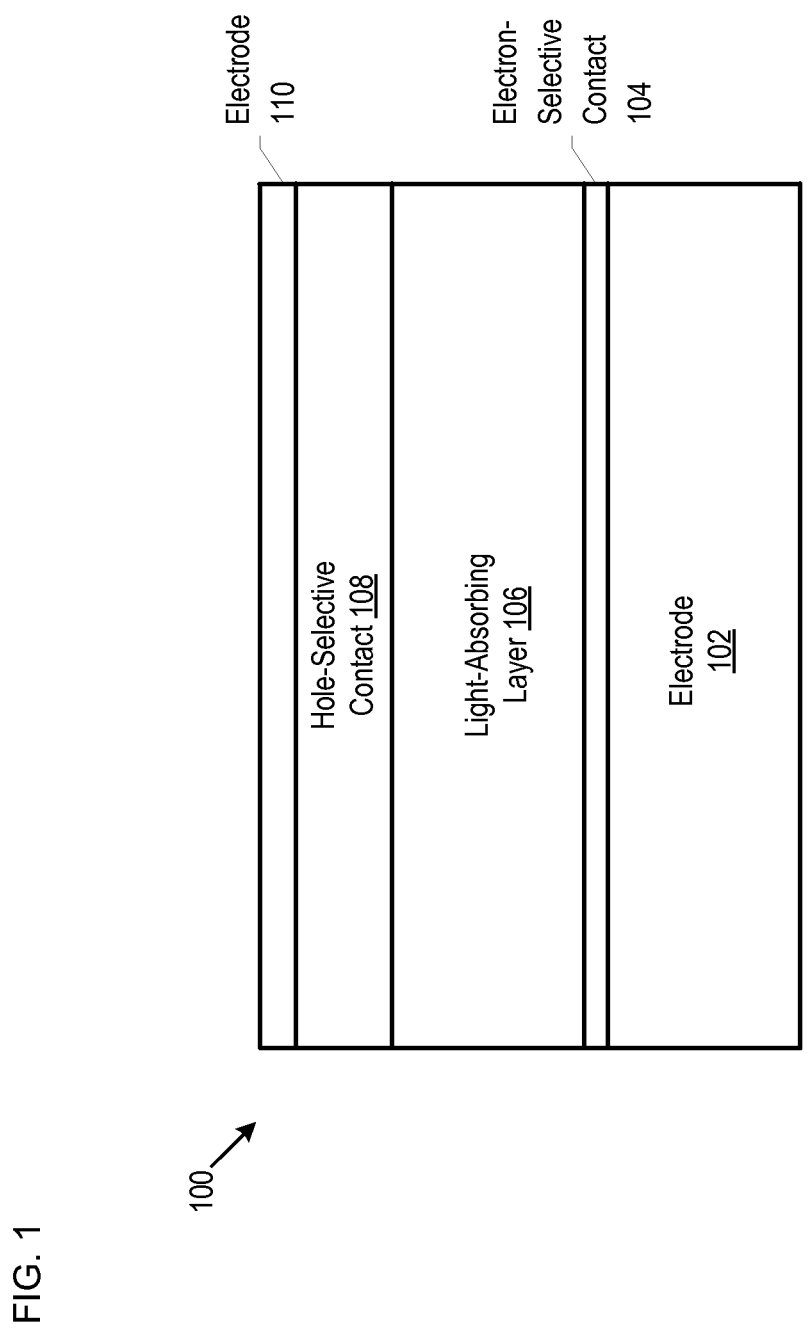
FIG. 1 depicts solar cell 100 in accordance with the illustrative embodiment of the present invention.

Solar Cell Structure. FIG. 1 depicts a cross-section of solar cell 100 in accordance with the illustrative embodiment of the present invention. Cell 100 includes optically transparent electrode 102, electron-selective contact 104, light-absorbing layer 106, hole-selective contact 108, and electrode 110, arranged as shown.

Electrode 102 is an electrically conductive layer that is substantially transparent for at least wavelengths of interest for a solar cell (e.g., from about 300 to about 1200 nanometers). In some embodiments, electrode 102 is implemented as a layer of electrically conductive material disposed on an optically transparent substrate. In the illustrative embodiment, the electrically conductive material is fluorine-doped tin oxide (FTO) and the substrate is glass. Other materials suitable for use as the electrically conductive material of electrode 102 include, without limitation, transparent conductive oxide (TCO), indium tin oxide (ITO), titanium nitride (TiN), aluminum-doped zinc oxide (AZO). Other materials suitable for use as the substrate include those that are substantially transparent to the wavelengths of interest such as, without limitation, plastic, quartz, and fused silica.

In the illustrative embodiment, electron-selective contact 104 (also known as a "hole-blocking layer") is a layer of titanium dioxide having a thickness of approximately 50 nanometers ("nm"). A thickness in the range of about 10 nm to about 100 nm is suitable for the hole-blocking layer. A thickness outside of this range is acceptable in principle, but at thicknesses below about 10 nm, it is difficult to produce a layer without pinholes and there is generally no benefit to have a thickness greater than about 100 nm; that is, a thickness greater than about 100 nm is excessive. As used herein and in the appended claims, the term "about" and "approximately," when referencing a quantity, is understood to mean "+/−15%." In some other embodiments, other wide-bandgap oxides, including without limitation, zinc oxides (e.g., ZnO), tin oxides (e.g., $SnO_2$), aluminum oxides (e.g., $Al_2O_3$), doped-oxides (niobium-doped titanium oxide, etc.), and the like may be suitable for use as the electron-selective contact.

Light-absorbing layer 106 comprises a layered, two-dimensional (2d) perovskite having the structure:

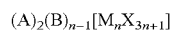 [1]

where:
A=$RNH_3^+$, R=organic group
B=$R'NH_3^+$, R'=organic group
M=metal
X=anion
n denotes that number of M-X sheets in each inorganic layer.

R can be, for example and without limitation, $C_6H_5(CH_2)_2$ or any of a variety of other organic groups as can be suitably selected by those skilled in the art in light of this disclosure. R' can be, for example and without limitation, $CH_3$ or any of a variety of other organic groups, or inorganics (e.g., cesium, etc.) as can be suitably selected by those skilled in the art in light of this disclosure. M, a metal, can be, for example and without limitation, Pb, Sn, Ge, Bi, Sb, Cu, Au, Ag, or any of a variety of other metals, including mixed metals, as can be suitably selected by those skilled in the art in light of this disclosure. X, an anion, can be, for example and without limitation, I, Br, Cl, F or any of a variety of other anions, including mixed anions, as can be suitably selected by those skilled in the art in light of this disclosure.

In some embodiments, n≤2. In some other embodiments, n=3. And in yet some additional embodiments, n=4 or n=5. In still further embodiments, layer 106 comprises a mixture of multiple different 2d-perovskites given by [1], wherein the 2d-perovskites composing layer 106 can vary in any one or more of the following: R, R', M, X, and/or n.

In some embodiments, hydrophobic groups are added to the organic layers to further increase moisture stability. In some embodiments, conjugated organic layers are added to facilitate charge transport between inorganic sheets. In some embodiments, organic photosensitizers are added to improve the absorption properties of the material. In still further embodiments, the inorganic sheets are doped with any of a variety of dopants, as suitably selected by one skilled in the art in light of this disclosure. In yet some additional embodiments, layer 106 comprises multiple different 2d-perovskites given by [1], wherein the 2d-perovskites composing layer 106 can vary in any one or more of the following: R, R', M, X, and/or n, and/or 2d-perovskites as modified in the ways mentioned in this paragraph.

In the illustrative embodiment, R=$C_6H_5(CH_2)_2$, R'=$CH_3$, M=Pb (lead), X=I (iodide). As such, in the illustrative embodiment, light-absorbing layer 106 comprises the 2d-perovskite having the structure:

$$(PEA)_2(MA)_{n-1}[Pb_nI_{3n+1}] \quad [2]$$

where:
PEA=$C_6H_5(CH_2)_2NH_3^+$ (2-phenylethylammonium),
MA=$CH_3NH_3^+$ (methylammonium)
n denotes that number of Pb—I sheets in each inorganic layer.

In the illustrative embodiment, n=3 for the 2d-perovskite having the structure given by [2]. In such an embodiment, light-absorbing layer 106 comprises a 2d-perovskite having the structure: $(PEA)_2(MA)_2[Pb_3 I_{10}]$.

In the illustrative embodiment, layer 106 has a thickness of 425 nm. A thickness in the range of about 300 nm to about 600 nm is suitable for layer 106. In still further embodiments, light-absorbing layer 106 comprises n>3 structures of the perovskite of the form $(PEA)_2(MA)_{n-1}[Pb_n I_{3n+1}]$; in some preferred embodiments, n=4 or n=5. In some embodiments, layer 106 comprises a combination of n≥3 structures of $(PEA)_2(MA)_{n-1}[Pb_n I_{3n+1}]$.

In some further embodiments, various organic groups in place of PEA and/or MA are added to alter functionality.

In the illustrative embodiment, hole-selective layer 108 (also known as an "electron blocking layer") is 2,2',7,7'-tetrakis-(N,N-di-p-methoxyphenylamine) 9,9'-spirobifluorene, hereinafter referred to as "spiro-OMeTAD." In the illustrative embodiment, layer 108 has a thickness of 125 nanometers, although a thickness within the range of about 50 nm to about 200 nm is acceptable. In some other embodiments, other compounds are used to form the hole-selective layer, including, without limitation, CuI (copper iodide) or CuSCN (copper(i) thiocyanate).

In some other embodiments, hole-selective contact 108 and electron-selective contact 104 are reversed; that is, with respect to FIG. 1, in such an embodiment layer 104 is the hole-selective contact and layer 108 is the electron-selective contact.

Electrode 110 is one of the two electrical contacts—electrode 102 is the other—by which electrical energy is extracted from solar cell 100. In the illustrative embodiment, electrode 110 is a layer of gold. In this embodiment, the thickness of electrode 110 is 75 nm. In some other embodiments, electrode 110 can be made of any of a variety of electrically conductive and preferably reflective materials. Transparent electrodes can also be used to enable sub-bandgap transmission to the bottom junction of a tandem solar cell. Electrode 110 can be of any suitable thickness, which will typically, but not necessarily be within the range of about 50 nm to about 200 nm.

Method of Fabrication.

FIG. 2 depicts method 200 for forming a solar cell in accordance with an illustrative embodiment of the present invention.

In accordance with operation 202, an electrode, which is optically transparent at the wavelengths of interest, is formed on an optically transparent substrate. The electrode (FIG. 1: electrode 102) itself must be optically transparent, and, as such, it is typically a layer of FTO, TCO, ITO, TiN, or AZO, as previously mentioned. Such materials are usually evaporated or sputtered on to a substrate, as is within the knowledge and capabilities of those skilled in the art.

Per operation 204, an electron-selective contact (i.e., FIG. 1: electron-selective contact 104) is formed on the electrode. In the illustrative embodiment, the electron-selective contact is titanium dioxide, although, as previously discussed, other wide-bandgap oxides, such as ZnO, $SnO_2$, and certain doped oxides can suitably be used. In the illustrative embodiment, the electron-selective contact is formed via aerosol spray pyrolysis, using air as a carrier gas. However, in some other embodiments, other conventional deposition processes, as known to those skilled in the art, can suitably be used to form the electron-selective contact.

As noted in conjunction with the structure of solar cell 100, in some other embodiments, the position of the electron-selective contact and the hole-selective contact is reversed. In such a case, operation 204 comprises forming a hole-selective contact on the electrode (and operation 208 comprises forming an electron-selective contact on the light-absorbing layer). It is to be understood, therefore, that the operations of method are permutable as appropriate.

In accordance with operation 206, a light-absorbing layer (i.e., FIG. 1: layer 106) is formed by spin coating a solution of a 2d-perovskite on to the electron-selective contact 104. The thickness of light-absorbing layer 106 can be controlled by adjusting the solution concentration and/or adjusting the spin coating speed, as will be appreciated by those skilled in the art.

As previously discussed, in the illustrative embodiment, the light-absorbing layer comprises the n=3 structure of the 2d-perovskite having the form $(PEA)_2(MA)_{n-1}[Pb_n I_{3n+1}]$. In some other embodiments, structures with n>3 are used as light-absorbing layer 106. In still further embodiments, other 2d-perovskites that form n=3 structures or n>3 structures are used as light-absorbing layer 106.

A hole-selective contact is formed, in operation 208, on light-absorbing layer 106. In the illustrative embodiment, the hole-selective contact (i.e., FIG. 1: hole-selective contact 108) comprises spiro-OMeTAD, which is deposited via spin coating. The thickness of hole-selective contact 108 can be controlled by adjusting the solution concentration and/or adjusting the spin coating speed, as is appreciated by those skilled in the art.

At operation 210, an electrode (i.e., FIG. 1: electrode 110) is formed on hole-selective contact 108. In the illustrative embodiment, electrode 110 is a layer of gold having a thickness of approximately 75 nm. The electrode is deposited using conventional metal deposition techniques, including, without limitation, techniques such as evaporation, e-beam evaporation, sputtering, and the like. Although in the illustrative embodiment electrode 110 comprises gold, it will be clear to one skilled in the art, after reading this Specification, how to specify, make, and use alternative embodiments of the present invention wherein electrode 110 comprises other electrically conductive and reflective materials, such as other metals, etc.

EXAMPLE

Synthesis of $(PEA)_2(MA)_{n-1}[Pb_n I_{3n+1}]$ for n=3

Synthesis of (PEA)I. Unstabilized hydroidoic acid ("HI") was purified using a 0.36 M tributyl phosphate solution in chloroform. A clear, colorless solution was obtained after 3-5 extractions. The HI solution was then added dropwise to a cold (0° C.) stirred solution of phenylethylamine (5.0 mL, 40 mmol) in ethanol (5.0 mL) until a colorless precipitate formed. The solid was filtered through paper and washed repeatedly with diethyl ether. A hot (60° C.), saturated isopropanol solution of the solid was prepared. (PEA)I was obtained with about 90 percent yield by cooling the solution to −10° C.

Synthesis of (MA)I. Purified HI was added dropwise to a 2.0 M solution of methylamine (10 mL, 20 mmol) in tetrahydrofuran. The solvent was removed under reduced pressure and the remaining colorless solid was washed repeatedly with diethyl ether and recrystallized in isopropanol as described above to obtain (MA)I at about 60 percent yield.

Synthesis of $(PEA)_2(MA)_2[Pb_3 I_{10}]$. Solid (PEA)I (144 mg, 0.578 mmol), (MA)I (92.0 mg, 0.578 mmol), and $PbI_2$ (400 mg, 0.868 mmol) were dissolved in N,N-dimethylformamide (0.87 mL) and filtered through paper.

EXAMPLE

Fabrication Solar Cell Fabrication

An FTO-coated glass slide (15 $\Omega sq^{-1}$) served as a substrate and transparent electrode (FIG. 1: electrode 102). FTO was removed from one edge of the glass slide by appropriately masking the slide and etching with Zn powder and 2 M HCL. (This was to avoid a shunt pathway upon contacting the finished device with the anode.) The etched substrate was cleaned, sequentially, with Extran® brand detergent (commercially available from EMD Millipore, a division of Merck KGaA, headquartered in Billerica, Mass.), acetone, isopropanol, and oxygen plasma.

A layer of $TiO_2$ (serving as electron-selective contact 104) was deposited by spray pyrolysis. Titanium diisopropoxide bis(actylacetonate) (3.0 mL, 6.2 mmol) was diluted in ethanol (27 mL) and sprayed onto the FTO-coated glass, which was maintained at 500° C. The nascent device was then cooled to room temperature, heated at 70° C. for 0.5 hours in a 0.04 M aqueous solution of $TiCl_4$, and then washed in deionized water.

A film of $(PEA)_2(MA)_2[Pb3 I_{10}]$(light-absorbing layer 106) was deposited on the $TiO_2$ layer by spincoating a solution of $(PEA)_2(MA)_2[Pb3 I_{10}]$(60 μL) at 3000 rpm for 45 seconds.

A layer of spiro-OMeTAD (hole-selective contact 108) was deposited on the $(PEA)_2(MA)_2[Pb3 I_{10}]$ as follows. A solution containing 12 mol percent pre-doped oxidized Spiro-OMeTAD was made by combining chemically oxidized Sprio-OMeTAD (12 mg, 0.007 mmol) and as-purchased Spiro-OMeTAD (62 mg, 0.051 mmol) in chlorobenzene (1 mL) and heating at 75° C. for 1 hour. Upon cooling, a 1.9 M lithium bis(trifluoromethane)sulfonamide solution in acetonitrile (17.5 μL) and 4-tert-butylpyridine (28.8 μL, 0.197 mmol) were added and the solution was filtered through a 2-micron PTFE syringe filter. This solution was deposited by spin coating at 4000 rpm over the film of $(PEA)_2(MA)_2[Pb3 I_{10}]$.

A layer of gold (electrode 110) was deposited on the layer of Spiro-OMeTAD by thermal evaporation at a pressure between 106 to $10^{-7}$ Torr and a deposition rate of 0.1 nanometers/second.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A solar cell including:
    a first electrode, wherein the first electrode is optically transparent for at least some wavelengths of light;
    a second electrode; and
    a light-absorbing layer disposed between the first electrode and the second electrode, wherein the light-absorbing layer comprises a mixture of different 2d-perovskites each having inorganic layers and each having the form:

$(A)_2(B)_{n-1}[M_nX_{3n+1}]$ where:
    A=$RNH_3^+$, R=organic group
    B=$R'NH_3^+$, R'=organic group
    M=metal
    X=anion
    n denotes the number of M-X sheets in each inorganic layer, and
    wherein for each of the 2d-perovskites in the mixture, n is at least 2, and further
    wherein the different 2d-perovskites vary in n.

2. The solar cell of claim 1 wherein for at least one of the 2d-perovskites in the mixture, R=$C_6H_5(CH_2)_2$.

3. The solar cell of claim 1 wherein for at least one of the 2d-perovskites in the mixture, R'=$CH_3$.

4. The solar cell of claim 1 wherein for at least one of the 2d-perovskites in the mixture, M is selected from the group consisting of Pb, Sn, Ge, Bi, Cu, Au, Ag, and Sb.

5. The solar cell of claim 1 wherein for at least one of the 2d-perovskites in the mixture, X is selected from the group consisting of I, Br, Cl, and F.

6. The solar cell of claim 1 wherein for one of the 2d-perovskites in the mixture, n is greater than or equal to 3.

7. The solar cell of claim 1 wherein for at least one of the 2d-perovskites in the mixture, R=$C_6H_5(CH_2)_2$, R'=$CH_3$, M=Pb, and X=I.

8. The solar cell of claim 7 wherein for one of the 2d-perovskites in the mixture, n=3.

9. The solar cell of claim 7 wherein for one of the 2d-perovskites in the mixture, n is greater than or equal to 3.

10. The solar cell of claim 1 further comprising:
    an electron-selective contact disposed on the first electrode;
    wherein the light-absorbing layer is disposed on the electron-selective contact;
    and a hole-selective contact disposed on the light-absorbing layer,
    wherein the second electrode is disposed on the hole-selective contact.

11. The solar cell of claim 10 wherein the first electrode comprises fluorine-doped tin oxide (FTO).

12. The solar cell of claim 10 wherein the electron-selective contact comprises titanium dioxide.

13. The solar cell of claim 10 wherein the hole-selective contact comprises spiro-OMeTAD.

14. The solar cell of claim 10 wherein the second electrode comprises gold.

15. The solar cell of claim 1 further comprising:
a hole-selective contact disposed on the first electrode;
wherein the light-absorbing layer is disposed on the hole-selective contact; and
an electron-selective contact disposed on the light-absorbing layer,
wherein the second electrode is disposed on the electron-selective contact.

16. The solar cell of claim 15 wherein the hole-selective contact comprises spiro-OMeTAD.

17. The solar cell of claim 1 wherein the different 2d-perovskites additionally vary in any one or more of the following: R, R', M, X.

* * * * *